United States Patent
Chen et al.

(10) Patent No.: US 10,135,466 B2
(45) Date of Patent: Nov. 20, 2018

(54) DATA SENDING METHOD AND APPARATUS

(71) Applicant: HUAWEI TECHNOLOGIES CO., LTD., Shenzhen (CN)

(72) Inventors: Zhouhui Chen, Chengdu (CN); Zheng Ma, Chengdu (CN); Wei Lin, Shenzhen (CN)

(73) Assignee: HUAWEI TECHNOLOGIES, Shenzhen (CN)

( * ) Notice: Subject to any disclaimer, the term of this patent is extended or adjusted under 35 U.S.C. 154(b) by 67 days.

(21) Appl. No.: 15/337,703

(22) Filed: Oct. 28, 2016

(65) Prior Publication Data

US 2017/0047945 A1  Feb. 16, 2017

Related U.S. Application Data

(63) Continuation of application No. PCT/CN2014/076641, filed on Apr. 30, 2014.

(51) Int. Cl.
*H03M 13/00* (2006.01)
*H03M 13/11* (2006.01)
(Continued)

(52) U.S. Cl.
CPC ..... *H03M 13/1177* (2013.01); *H03M 13/005* (2013.01); *H03M 13/116* (2013.01);
(Continued)

(58) Field of Classification Search
CPC .......... H03M 13/116; H03M 13/1128; H03M 13/1171; H03M 13/005; H03M 13/1177;
(Continued)

(56) References Cited

U.S. PATENT DOCUMENTS 7,222,284 B2 * 5/2007 Stolpman ............ H03M 13/033
714/774
8,392,789 B2 * 3/2013 Biscondi ............ H03M 13/1114
375/262
(Continued)

FOREIGN PATENT DOCUMENTS

CN  101630989  1/2010
CN  102546122  7/2012
(Continued)

OTHER PUBLICATIONS

International Search Report dated Jan. 28, 2015 in corresponding International Application No. PCT/CN2014/076641.
(Continued)

*Primary Examiner* — Phung M Chung
(74) *Attorney, Agent, or Firm* — Staas & Halsey LLP

(57) ABSTRACT

The present invention discloses a data sending method and apparatus, which resolves a problem that performance of a high coding rate LDPC code obtained in an existing puncturing manner based on a variable node degree distribution is relatively poor. The method includes: encoding, by using an LDPC code check matrix, an information bit that needs to be sent, to obtain a codeword sequence; determining a puncturing priority of each parity bit in the codeword sequence according to row destruction and/or cycle destruction, on the LDPC code check matrix, of a variable node corresponding to each parity bit; puncturing the codeword sequence according to the puncturing priority of each parity bit in the codeword sequence; and generating a bit sequence according to the punctured codeword sequence, and sending the bit sequence. In this way, performance of an obtained high coding rate LDPC code is improved.

14 Claims, 8 Drawing Sheets

(51) Int. Cl.
  *H04B 7/06* (2006.01)
  *H04L 1/00* (2006.01)
(52) U.S. Cl.
  CPC ..... *H03M 13/1185* (2013.01); *H03M 13/616* (2013.01); *H03M 13/6362* (2013.01); *H03M 13/6527* (2013.01); *H04L 1/00* (2013.01); *H04L 1/0013* (2013.01); *H04L 1/0057* (2013.01)
(58) Field of Classification Search
  CPC ............ H03M 13/616; H03M 13/6362; H04L 1/0013; H04L 1/0057
  See application file for complete search history.

(56) References Cited

U.S. PATENT DOCUMENTS

| | | | |
|---|---|---|---|
| 9,197,250 | B2* | 11/2015 | Jeong ................. H03M 13/033 |
| 2010/0107033 | A1 | 4/2010 | Kuri et al. |
| 2014/0258815 | A1 | 9/2014 | Jeong et al. |
| 2016/0285477 | A1* | 9/2016 | Petrov ................ H03M 13/1165 |

FOREIGN PATENT DOCUMENTS

| | | |
|---|---|---|
| WO | WO2007085653 | 8/2007 |
| WO | WO2013055046 | 4/2013 |

OTHER PUBLICATIONS

International Search Report, dated Jan. 28, 2015, in International Application No. PCT/CN2014/076641 (4 pp.).
Extended European Search Report, dated Apr. 6, 2017, in European Application No. 14890885.8 (10 pp.).
Ha, J. et al., *Optimal Puncturing of Irregular Low-Density Parity-Check Codes*, 2003 IEEE, XP10643019A, pp. 3110-3114.
Ha, J. et al., *Rate-Compatible Punctured Low-Density Parity-Check Codes With Short Block Lengths*, IEEE Transactions on Information Theory, vol. 52, No. 2, Feb. 2006, XP002365287, pp. 728-738.
Zhang, J. et al., *Two-Dimensional Correction for Min-Sum Decoding of Irregular LDPC Codes*, IEEE Communications Letters, vol. 10, No. 3, Mar. 2006, pp. 180-182.
Cao, Y. et al., *Degree distribution based HARQ for irregular LDPC*, Electronics Letters, Mar. 16, 2006, vol. 42, No. 6 (2 pp.).
Su, H. et al., *An Effective Puncturing Scheme for RateCompatible LDPC Codes*, 2010 IEEE, XP31798795A (6 pp.).
Liu, J. et al., *Novel Intentional Puncturing Schemes for Finite-Length Irregular LDPC Codes*, 2011 IEEE, XP32047961A (6 pp.).
*IEEE Standard for Information technology—Telecommunications and information exchange between systems Local and metropolitan area networks—Specific requirements, Part 11: Wireless LAN Medium Access Control (MAC) and Physical Layer (PHY) Specifications*, IEEE Std 802.11-2012, pp. 1-2695.
*IEEE Standard for Information technology—Telecommunications and information exchange between systems Local and metropolitan area networks—Specific requirements, Part 11: Wireless LAN Medium Access Control (MAC) and Physical Layer (PHY) Specifications, Amendment 4: Enhancements for Very High Throughput for Operation in Bands below 6 GHz*, IEEE Std 802.11ac-2013, pp. 1-395.

* cited by examiner

DATA SENDING METHOD AND APPARATUS

CROSS-REFERENCE TO RELATED APPLICATIONS

This application is a continuation of International Application No. PCT/CN2014/076641, filed on Apr. 30, 2014, the disclosure of which is hereby incorporated by reference in its entirety.

TECHNICAL FIELD

The present invention relates to the field of wireless communications technologies, and in particular, to a data sending method and apparatus using a low density parity check (Low Density Parity Check, LDPC) code for encoding.

BACKGROUND

A future broadband wireless communications system needs to implement, on limited spectrum resources, high-speed and reliable transmission of comprehensive service content. Therefore, a highly reliable channel encoding solution is required. As a channel encoding solution whose performance may be close to that of a channel capacity, an LDPC code has many advantages such as parallel and high-speed decoding, low error leveling, self-interleaving, and flexible coding rate design, and therefore, has become an optional channel encoding solution of a wireless local area network (Wireless Local Area Network, WLAN) standard (that is, the Institute of Electrical and Electronic Engineers (Institute of Electrical and Electronic Engineers, IEEE) 802.11ac standard).

The LDPC code is a type of special (N,K) linear block code, where N,K are a code length and an information bit length, respectively. In an LDPC code check matrix $H=\{H_{i,j}\}$, most elements are 0, and a few elements are 1, that is, H is a sparse matrix. The LDPC code may also be equivalently determined by a factor diagram (Tanner diagram) of the LDPC code, the Tanner diagram and the LDPC code check matrix are in a one-to-one correspondence, and the Tanner diagram includes a variable node set $\{V_i\}$ and a check node set $\{C_i\}$. A check node $C_i$ in the Tanner diagram is corresponding to an $i^{th}$ row in the H, that is, an $i^{th}$ check equation in the matrix; while a variable node $V_j$ is corresponding to a $j^{th}$ column in the H, that is, a $j^{th}$ bit in an encoded codeword. The following uses a 4×8-dimensional LDPC code check matrix as an example for description, and the LDPC code check matrix H is as follows:

$$H = \begin{bmatrix} 1 & 0 & 1 & 0 & 1 & 0 & 1 & 0 \\ 1 & 0 & 0 & 1 & 0 & 1 & 0 & 1 \\ 0 & 1 & 1 & 0 & 0 & 1 & 1 & 0 \\ 0 & 1 & 0 & 1 & 1 & 0 & 0 & 1 \end{bmatrix}.$$

FIG. 1 is a Tanner diagram corresponding to the LDPC code check matrix H. The check node $C_i$ in the Tanner diagram is corresponding to the $i^{th}$ row in the H, and the variable node $V_j$ in the Tanner diagram is corresponding to the $i^{th}$ column in the H. For example, a check equation corresponding to a check node $C_1$ is: $V_1+V_3+V_5+V_7=0$. A node set $\{V_3, C_3, V_7, C_1\}$ in FIG. 1 forms a cycle with a length of 4.

The LDPC code check matrix H used in the existing WLAN standard (IEEE 802.11ac) has systematic (Systematic) and quasi-cyclic (Quasi-Cyclic) structures. FIG. 2 is a used LDPC code check matrix H with a code length of N=648 and a coding rate of R=½. Each element in the 12×24-dimensional mother matrix represents a z=N/24-order square matrix, where "-" in the mother matrix represents a z×z-order all-zero square matrix, $i(0 \leq i \leq z-1)$ represents a square matrix $P_z^i$ obtained by cyclically shifting to the right by i bits in each row in a z×z-order unit matrix, 0 is the z×z-order unit matrix, and an example of $P_z^1$ is as follows:

$$\begin{bmatrix} 0 & 1 & 0 & \cdots & 0 \\ 0 & 0 & 1 & \cdots & 0 \\ \vdots & \vdots & \vdots & \ddots & \vdots \\ 0 & 0 & 0 & \cdots & 1 \\ 1 & 0 & 0 & \cdots & 0 \end{bmatrix}.$$

On a time-varying channel from which channel state information may be obtained, using an error control policy proactively adaptive to an encoding rate according to different channel conditions can improve system transmission efficiency on the premise of ensuring reliability. In this case, a solution in which multiple encoder pairs and decoder pairs are used has excessively high implementation complexity; therefore, a rate compatible channel encoding solution in which a single pair of encoder and decoder is more implementable. When a rate compatible LDPC encoding solution is to be designed, first, an LDPC code check matrix with a medium coding rate is designed as a mother code, and then the coding rate may be flexibly improved or reduced respectively by means of puncturing (Puncturing) or repetition (Repetition).

A coding rate of an LDPC code with a given parameter is R=K/N, and if a high rate code with a coding rate of R'>R is expected to be obtained, a quantity of variable nodes that need to be punctured is: $m_p=N-K/R'$. $m_p$ bits are randomly deleted from a parity bit part in a codeword sequence encoded by using an LDPC code check matrix, to obtain a high rate code with a coding rate of R', where the puncturing manner is random puncturing. In a current hybrid automatic repeat request (HARQ, Hybrid Automatic Repeat reQuest) system, puncturing manners of LDPC codes are mostly a random puncturing solution. In this manner, each time when a high rate LDPC code is constructed by using a low rate LDPC code, a location of a deleted bit is randomly selected. During decoding, a receive end needs to know a to-be-deleted matrix in advance. As a result, during each transmission, extra overheads are needed to send the to-be-deleted matrix to the receive end, which causes a waste of system resources. In addition, a puncturing location and order of the LDPC code check matrix are not optimized in random puncturing; therefore, relatively favorable puncturing performance cannot be provided.

To improve the foregoing puncturing manner, a puncturing manner based on a variable node degree distribution is provided, that is, a parity bit corresponding to a lower variable node degree is preferentially punctured. This manner is based on analysis of decoding performance of an irregular LDPC code, and a variable node with a higher degree may obtain more check information in iterative decoding; therefore, decoding convergence is faster and reliability is higher. Based on such analysis, a variable node with a lower degree has smaller impact on the decoding performance. An LDPC code used in the WLAN standard is a systematic code, and in a matrix obtained by means of encoding by using an LDPC code check matrix, the left half part is an information part, and the right half part is a check part. A bit corresponding to a column in the information part is an information bit in an encoded codeword, and a bit corresponding to a column in the check part is a parity bit in the encoded codeword. When coding rates are transformed, during puncturing in all solutions, only a parity bit is punctured. As can be seen from FIG. 2, degrees of the first Z columns of the check part of the LDPC code check matrix H in the WLAN standard are all 3, and degrees of all remaining columns are 2. It is stipulated in the IEEE 802.11ac standard that puncturing is performed sequentially in a reverse order starting from the last column of the LDPC code check matrix to the front, that is, in an LDPC code puncturing solution used in the WLAN standard, puncturing is performed based on the degree distribution. However, because most degrees corresponding to parity bits of a check matrix in the WLAN standard are 2, and only a few degrees are 3, performing puncturing according to the degree distribution cannot effectively distinguish the parity bits, and it is quite difficult to determine a parity bit that needs to be preferentially punctured. Because in this manner, all parity bits with a degree of 2 are also randomly punctured, preferable relatively favorable performance also cannot be provided.

In conclusion, to-be-punctured parity bits that use LDPC codes cannot be effectively distinguished in an existing puncturing manner based on a variable node degree distribution, and performance of an obtained high coding rate LDPC code is relatively poor.

SUMMARY

The present invention provides a data sending method and apparatus, which resolve a problem of relatively poor performance of a high coding rate LDPC code obtained in an existing puncturing manner based on a variable node degree distribution.

According to a first aspect, a data sending method is provided, where the method includes:

encoding, by using a low density parity check LDPC code check matrix, an information bit that needs to be sent, to obtain a codeword sequence, where the codeword sequence includes the information bit and parity bits;

determining a puncturing priority of each parity bit in the codeword sequence according to row destruction and/or cycle destruction, on the LDPC code check matrix, of a variable node corresponding to each parity bit;

puncturing the codeword sequence according to the puncturing priority of each parity bit in the codeword sequence; and generating a bit sequence according to the punctured codeword sequence, and sending the bit sequence, wherein the row destruction is used to measure impact of the variable node in the LDPC code check matrix on correct decoding of variable nodes adjacent to the variable node, where the adjacent variable nodes are variable nodes that are adjacent to the variable node and that are of variable nodes connected to check nodes connected to the variable node; and the cycle destruction is used to measure impact of the variable node in the LDPC code check matrix on correct decoding of variable nodes traversed by a minimum cycle corresponding to the variable node, where the minimum cycle corresponding to the variable node is a closed figure, with a minimum length, formed by connecting the variable node to surrounding variable nodes and check nodes.

With reference to the first aspect, in a first possible implementation manner, for each parity bit in the codeword sequence, the row destruction, on the LDPC code check matrix, of the variable node corresponding to the parity bit is determined according to the following formula:

$$RowDestruction(i) = \sum_{m \in G_C(i)} D(m),$$

where

RowDestruction(i) represents row destruction caused to the LDPC code check matrix by a variable node VN(i) corresponding to an $i^{th}$ parity bit in the codeword sequence, where i=1, 2, ..., N and N represents a quantity of the parity bits in the codeword sequence; $G_C(i)$ represents a set of check nodes CN(m) connected to the variable node VN(i), where m=1, ..., M, and M represents a quantity of the check nodes connected to the variable node VN(i); and D(m) represents a quantity of variable nodes that are adjacent to the variable node VN(i) and that are of the variable nodes connected to the check node CN(m) in the LDPC code check matrix.

With reference to the first possible implementation manner of the first aspect, in a second possible implementation manner, the determining a puncturing priority of each parity bit in the codeword sequence according to row destruction, on the LDPC code check matrix, of a variable node corresponding to each parity bit includes:

sequentially determining the puncturing priorities of the parity bits in the codeword sequence in ascending order of values of row destruction, on the LDPC code check matrix, of the variable nodes corresponding to the parity bits in the codeword sequence, where a puncturing priority of a parity bit corresponding to a variable node with a smaller row destruction value is lower than a puncturing priority of a parity bit corresponding to a variable node with a larger row destruction value.

With reference to the first aspect, in a third possible implementation manner, for each parity bit in the codeword sequence, the cycle destruction, on the LDPC code check matrix, of the variable node corresponding to the parity bit is determined according to the following formula:

CycDestruction(i)=CycNum(i)*S, where

CycDestruction(i) represents cycle destruction caused to the LDPC code check matrix by a variable node VN(i) corresponding to an $i^{th}$ parity bit in the codeword sequence, where i=1, 2, ..., N, and N represents a quantity of the parity bits in the codeword sequence; CycNum(i) represents a quantity of minimum cycles formed by connecting the variable node VN(i) in the LDPC code check matrix to surrounding variable nodes and check nodes; and S is a specified optimization factor, and S>0.

With reference to the third possible implementation manner of the first aspect, in a fourth possible implementation manner, the determining a puncturing priority of each parity bit in the codeword sequence according to cycle destruction, on the LDPC code check matrix, of a variable node corresponding to each parity bit includes:

sequentially determining the puncturing priorities of the parity bits in the codeword sequence in ascending order of values of cycle destruction, on the LDPC code check matrix, of the variable nodes corresponding to the parity bits in the codeword sequence, where a puncturing priority of a parity bit corresponding to a variable node with a smaller cycle destruction value is lower than a puncturing priority of a parity bit corresponding to a variable node with a larger cycle destruction value.

With reference to any one of the first aspect, or the first to the fourth possible implementation manners of the first aspect, in a fifth possible implementation manner, the determining a puncturing priority of each parity bit in the codeword sequence according to row destruction and cycle destruction, on the LDPC code check matrix, of a variable node corresponding to each parity bit includes:

for each parity bit in the codeword sequence, performing summation on the row destruction and the cycle destruction, on the LDPC code check matrix, of the variable node corresponding to the parity bit, and using an obtained sum value as total destruction, on the LDPC code check matrix, of the variable node corresponding to the parity bit; and sequentially determining the puncturing priorities of the parity bits in the codeword sequence in ascending order of values of total destruction, on the LDPC code check matrix, of the variable nodes corresponding to the parity bits in the codeword sequence, where a puncturing priority of a parity bit corresponding to a variable node with a smaller total destruction value is lower than a puncturing priority of a parity bit corresponding to a variable node with a larger total destruction value.

With reference to the first aspect, in a sixth possible implementation manner, the puncturing the codeword sequence according to the puncturing priority of each parity bit in the codeword sequence includes:

determining, in the codeword sequence, a quantity of parity bits that need to be punctured; and puncturing, in ascending order of the puncturing priorities of the parity bits in the codeword sequence, the codeword sequence according to the determined quantity of parity bits that need to be punctured.

According to a second aspect, a data sending apparatus is provided, where the apparatus includes:

an encoding module, configured to encode, by using an LDPC code check matrix, an information bit that needs to be sent, to obtain a codeword sequence, where the codeword sequence includes the information bit and parity bits;

a priority determining module, configured to determine a puncturing priority of each parity bit in the codeword sequence according to row destruction and/or cycle destruction, on the LDPC code check matrix, of a variable node corresponding to each parity bit;

a puncturing module, configured to puncture the codeword sequence according to the puncturing priority of each parity bit in the codeword sequence; and a sending module, configured to: generate a bit sequence according to the punctured codeword sequence, and send the bit sequence, where the row destruction is used to measure impact of the variable node in the LDPC code check matrix on correct decoding of variable nodes adjacent to the variable node, where the adjacent variable nodes are variable nodes that are adjacent to the variable node and that are of variable nodes connected to check nodes connected to the variable node; and the cycle destruction is used to measure impact of the variable node in the LDPC code check matrix on correct decoding of variable nodes traversed by a minimum cycle corresponding to the variable node, where the minimum cycle corresponding to the variable node is a closed figure, with a minimum length, formed by connecting the variable node to surrounding variable nodes and check nodes.

With reference to the second aspect, in a first possible implementation manner, for each parity bit in the codeword sequence, the priority determining module determines the row destruction, on the LDPC code check matrix, of the variable node corresponding to the parity bit according to the following formula:

$$RowDestruction(i) = \sum_{m \in G_c(i)} D(m),$$

where

RowDestruction(i) represents row destruction caused to the LDPC code check matrix by a variable node VN(i) corresponding to an $i^{th}$ parity bit in the codeword sequence, where i=1, 2, ..., N and N represents a quantity of the parity bits in the codeword sequence; $G_C(i)$ represents a set of check nodes CN(m) connected to the variable node VN(i), where m=1, ..., M, and M represents a quantity of the check nodes connected to the variable node VN(i); and D(m) represents a quantity of variable nodes that are adjacent to the variable node VN(i) and that are of the variable nodes connected to the check node CN(m) in the LDPC code check matrix.

With reference to the first possible implementation manner of the second aspect, in a second possible implementation manner, the priority determining module is specifically configured to:

sequentially determine the puncturing priorities of the parity bits in the codeword sequence in ascending order of values of row destruction, on the LDPC code check matrix, of the variable nodes corresponding to the parity bits in the codeword sequence, where a puncturing priority of a parity bit corresponding to a variable node with a smaller row destruction value is lower than a puncturing priority of a parity bit corresponding to a variable node with a larger row destruction value.

With reference to the second aspect, in a third possible implementation manner, for each parity bit in the codeword sequence, the priority determining module determines the cycle destruction, on the LDPC code check matrix, of the variable node corresponding to the parity bit according to the following formula:

CycDestruction(i)=CycNum(i)*S, where

CycDestruction(i) represents cycle destruction caused to the LDPC code check matrix by a variable node VN(i) corresponding to an $i^{th}$ parity bit in the codeword sequence, where i=1, 2, ..., N and N represents a quantity of the parity bits in the codeword sequence; CycNum(i) represents a quantity of minimum cycles formed by connecting the variable node VN(i) in the LDPC code check matrix to surrounding variable nodes and check nodes; and S is a specified optimization factor, and S>0.

With reference to the third possible implementation manner of the second aspect, in a fourth possible implementation manner, the priority determining module is specifically configured to:

sequentially determine the puncturing priorities of the parity bits in the codeword sequence in ascending order of values of cycle destruction, on the LDPC code check matrix, of the variable nodes corresponding to the parity bits in the codeword sequence, where a puncturing priority of a parity bit corresponding to a variable node with a smaller cycle destruction value is lower than a puncturing priority of a parity bit corresponding to a variable node with a larger cycle destruction value.

With reference to any one of the second aspect, or the first to the fourth possible implementation manners of the second aspect, in a fifth possible implementation manner, the priority determining module is specifically configured to:

for each parity bit in the codeword sequence, perform summation on the row destruction and the cycle destruction, on the LDPC code check matrix, of the variable node corresponding to the parity bit, and use an obtained sum value as total destruction, on the LDPC code check matrix, of the variable node corresponding to the parity bit; and sequentially determine the puncturing priorities of the parity bits in the codeword sequence in ascending order of values of total destruction, on the LDPC code check matrix, of the variable nodes corresponding to the parity bits in the codeword sequence, where a puncturing priority of a parity bit corresponding to a variable node with a smaller total destruction value is lower than a puncturing priority of a parity bit corresponding to a variable node with a larger total destruction value.

With reference to the second aspect, in a sixth possible implementation manner, the puncturing module is specifically configured to:

determine, in the codeword sequence, a quantity of parity bits that need to be punctured; and puncture, in ascending order of the puncturing priorities of the parity bits in the codeword sequence, the codeword sequence according to the determined quantity of parity bits that need to be punctured.

According to a third aspect, a communications device is provided, where the device includes:

a processor, configured to: encode, by using an LDPC code check matrix, an information bit that needs to be sent, to obtain a codeword sequence, where the codeword sequence includes the information bit and parity bits; determine a puncturing priority of each parity bit in the codeword sequence according to row destruction and/or cycle destruction, on the LDPC code check matrix, of a variable node corresponding to each parity bit; puncture the codeword sequence according to the puncturing priority of each parity bit in the codeword sequence; and generate a bit sequence according to the punctured codeword sequence; and a transmitter, configured to send the bit sequence generated by the processor, where the row destruction is used to measure impact of the variable node in the LDPC code check matrix on correct decoding of variable nodes adjacent to the variable node, where the adjacent variable nodes are variable nodes that are adjacent to the variable node and that are of variable nodes connected to check nodes connected to the variable node; and the cycle destruction is used to measure impact of the variable node in the LDPC code check matrix on correct decoding of variable nodes traversed by a minimum cycle formed by connecting the variable node to surrounding variable nodes and check nodes.

The transmitter and the processor in the communications device provided in the present invention are connected by using a bus.

With reference to the third aspect, in a first possible implementation manner, for each parity bit in the codeword sequence, the processor determines the row destruction, on the LDPC code check matrix, of the variable node corresponding to the parity bit according to the following formula:

$$RowDestruction(i) = \sum_{m \in G_C(i)} D(m),$$

where

RowDestruction(i) represents row destruction caused to the LDPC code check matrix by a variable node VN(i) corresponding to an $i^{th}$ parity bit in the codeword sequence, where i=1, 2, . . . , N and N represents a quantity of the parity bits in the codeword sequence; $G_C(i)$ represents a set of check nodes VN(i) connected to the variable node CN(m), where m=1, . . . , M, and M represents a quantity of the check nodes connected to the variable node VN(i); and D(m) represents a quantity of variable nodes that are adjacent to the variable node VN(i) and that are of the variable nodes connected to the check node CN(m) in the LDPC code check matrix.

With reference to the first possible implementation manner of the third aspect, in a second possible implementation manner, the processor is specifically configured to:

sequentially determine the puncturing priorities of the parity bits in the codeword sequence in ascending order of values of row destruction, on the LDPC code check matrix, of the variable nodes corresponding to the parity bits in the codeword sequence, where a puncturing priority of a parity bit corresponding to a variable node with a smaller row destruction value is lower than a puncturing priority of a parity bit corresponding to a variable node with a larger row destruction value.

With reference to the third aspect, in a third possible implementation manner, for each parity bit in the codeword sequence, the processor determines the cycle destruction, on the LDPC code check matrix, of the variable node corresponding to the parity bit according to the following formula:

CycDestruction(i)=CycNum(i)*S, where

CycDestruction(i) represents cycle destruction caused to the LDPC code check matrix by a variable node VN(i) corresponding to an $i^{th}$ parity bit in the codeword sequence, where i=1, 2, . . . , N, and N represents a quantity of the parity bits in the codeword sequence; CycNum(i) represents a quantity of minimum cycles formed by connecting the variable node VN(i) in the LDPC code check matrix to surrounding variable nodes and check nodes; and S is a specified optimization factor, and S>0.

With reference to the third possible implementation manner of the third aspect, in a fourth possible implementation manner, the processor is specifically configured to:

sequentially determine the puncturing priorities of the parity bits in the codeword sequence in ascending order of values of cycle destruction, on the LDPC code check matrix, of the variable nodes corresponding to the parity bits in the codeword sequence, where a puncturing priority of a parity bit corresponding to a variable node with a smaller cycle destruction value is lower than a puncturing priority of a parity bit corresponding to a variable node with a larger cycle destruction value.

With reference to any one of the third aspect, or the first to the fourth possible implementation manners of the third aspect, in a fifth possible implementation manner, the processor is specifically configured to:

for each parity bit in the codeword sequence, perform summation on the row destruction and the cycle destruction, on the LDPC code check matrix, of the variable node corresponding to the parity bit, and use an obtained sum value as total destruction, on the LDPC code check matrix, of the variable node corresponding to the parity bit; and sequentially determine the puncturing priorities of the parity bits in the codeword sequence in ascending order of values of total destruction, on the LDPC code check matrix, of the variable nodes corresponding to the parity bits in the codeword sequence, where a puncturing priority of a parity bit corresponding to a variable node with a smaller total destruction value is lower than a puncturing priority of a parity bit corresponding to a variable node with a larger total destruction value.

With reference to the third aspect, in a sixth possible implementation manner, the processor is specifically configured to:

determine, in the codeword sequence, a quantity of parity bits that need to be punctured; and puncture, in ascending order of the puncturing priorities of the parity bits in the codeword sequence, the codeword sequence according to the determined quantity of parity bits that need to be punctured.

According to the data sending method and apparatus or the communications device provided in the present invention, when a parity bit in a codeword sequence is punctured, a puncturing priority corresponding to each parity bit in the codeword sequence is determined by using row destruction and/or cycle destruction, on an LDPC code check matrix, of a variable node corresponding to each parity bit, and the codeword sequence is punctured according to the puncturing priority corresponding to each parity bit in the codeword sequence, so that parity bits of LDPC codes can be effectively distinguished, thereby improving performance of an obtained high coding rate LDPC code.

DESCRIPTION OF EMBODIMENTS

In the present invention, a puncturing priority corresponding to each parity bit in a codeword sequence is determined by using row destruction and/or cycle destruction, on an LDPC code check matrix, of a variable node corresponding to each parity bit, and the codeword sequence is punctured according to the puncturing priority corresponding to each parity bit in the codeword sequence, so that parity bits of LDPC codes in a WLAN standard can be effectively distinguished, thereby improving performance of an obtained high coding rate LDPC code, and also improving error control performance of the LDPC code.

The following further describes the present invention in detail with reference to the accompanying drawings in this specification. It should be understood that the embodiments described herein are merely used to describe and explain the present invention but are not intended to limit the present invention.

Figures 1, 2:
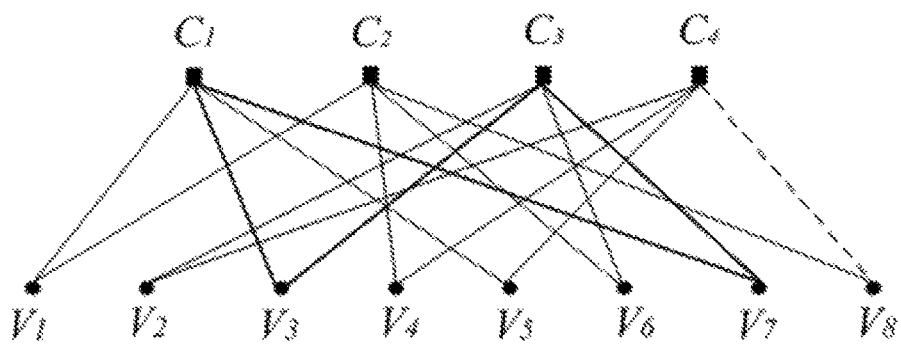
FIG. 1 is a Tanner diagram corresponding to an LDPC code check matrix according to the background.
FIG. 2 is a schematic diagram of a check matrix of an LDPC code with a code length of N=648 and a coding rate of R=½ according to the background.
Figure 3:
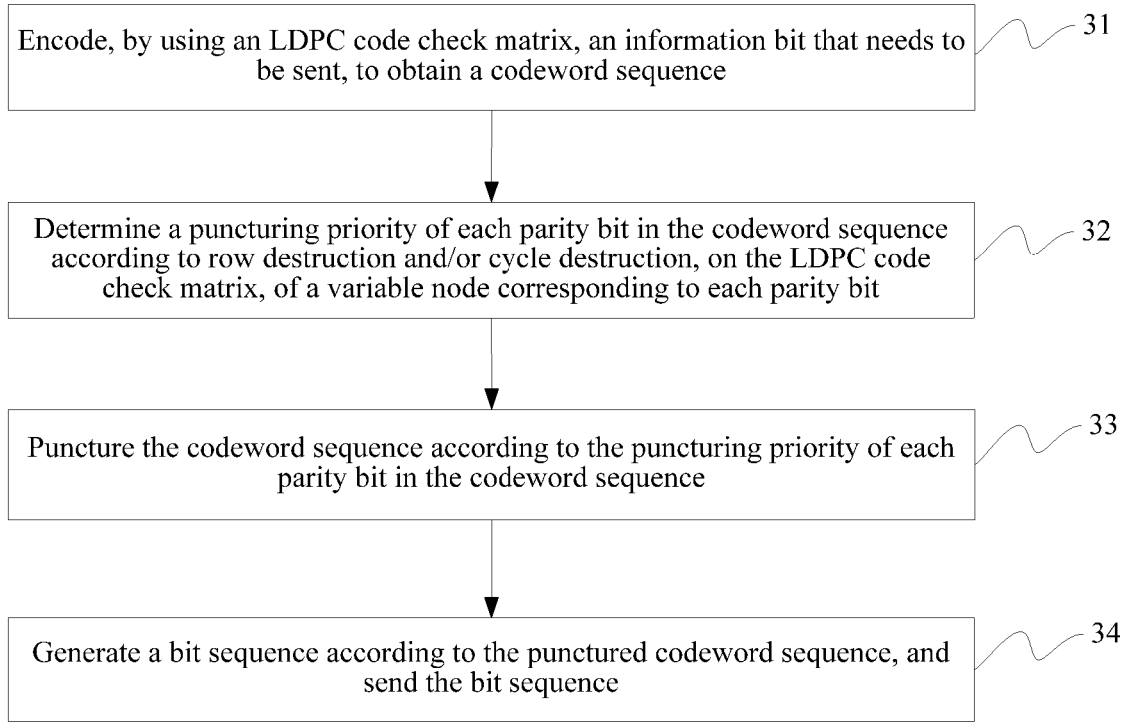
FIG. 3 is a schematic flowchart of a data sending method according to the present invention.

The present invention provides a data sending method. Referring to FIG. 3, the method includes:

Step 31: Encode, by using an LDPC code check matrix, an information bit that needs to be sent, to obtain a codeword sequence.

Step 32: Determine a puncturing priority of each parity bit in the codeword sequence according to row destruction and/or cycle destruction, on the LDPC code check matrix, of a variable node corresponding to each parity bit.

The row destruction, on the LDPC code check matrix, of each variable node is used to measure impact of the variable node in the LDPC code check matrix on correct decoding of variable nodes adjacent to the variable node, where the adjacent variable nodes are variable nodes that are adjacent to the variable node and that are of variable nodes connected to check nodes connected to the variable node.

The cycle destruction, on the LDPC code check matrix, of each variable node is used to measure impact of the variable node in the LDPC code check matrix on correct decoding of variable nodes traversed by a minimum cycle corresponding to the variable node, where the minimum cycle corresponding to the variable node is a closed figure, with a minimum length, formed by connecting the variable node to surrounding variable nodes and check nodes.

Step 33: Puncture the codeword sequence according to the puncturing priority of each parity bit in the codeword sequence.

In this step, puncturing the codeword sequence refers to puncturing a parity bit in the codeword sequence.

In this step, a quantity of parity bits in the codeword sequence that need to be punctured by means of puncturing processing may be determined according to parameters such as a coding rate and a code length, that need to be improved, of an LDPC code.

Step 34: Generate a bit sequence according to the punctured codeword sequence, and send the bit sequence.

In this step, a bit sequence is generated according to the information bit that needs to be sent and the punctured parity bit, where the bit sequence includes the information bit and the punctured parity bit.

Correspondingly, after receiving the foregoing bit sequence, a receive end performs reverse puncturing processing on the punctured codeword sequence, to restore the punctured parity bit; and performs decoding processing on the codeword sequence according to the restored codeword sequence, to obtain the information bit.

In the present invention, an information bit that needs to be sent is encoded by using an LDPC code check matrix, to obtain a codeword sequence; a puncturing priority of each parity bit in the codeword sequence is determined according to row destruction and/or cycle destruction, on the LDPC code check matrix, of a variable node corresponding to each parity bit; the codeword sequence is punctured according to the puncturing priority of each parity bit in the codeword sequence; and a bit sequence is generated according to the punctured codeword sequence, and the bit sequence is sent. The puncturing priority corresponding to each parity bit in the codeword sequence is determined by using the row destruction and/or the cycle destruction, on the LDPC code check matrix, of the variable node corresponding to each parity bit, and the codeword sequence is punctured according to the puncturing priority corresponding to each parity bit in the codeword sequence, so that parity bits of LDPC codes can be effectively distinguished, thereby improving performance of an obtained high coding rate LDPC code, and also improving error control performance of the LDPC code.

In the present invention, because an LDPC code check matrix used in a standard is fixed, of a puncturing priority of each parity bit may be determined offline, that is, a puncturing pattern of a codeword sequence may be determined in advance. Therefore, the puncturing solution of the present invention does not increase system implementation complexity, and has relatively strong competitive strength.

The following describes definitions of the row destruction and the cycle destruction involved in the present invention by using examples.

First: For each variable node, the row destruction, on the LDPC code check matrix, of the variable node is used to measure impact of the variable node in the LDPC code check matrix on correct decoding of variable nodes adjacent to the variable node, where the adjacent variable nodes are variable nodes that are adjacent to the variable node and that are of variable nodes connected to check nodes connected to the variable node.

Figure 4:
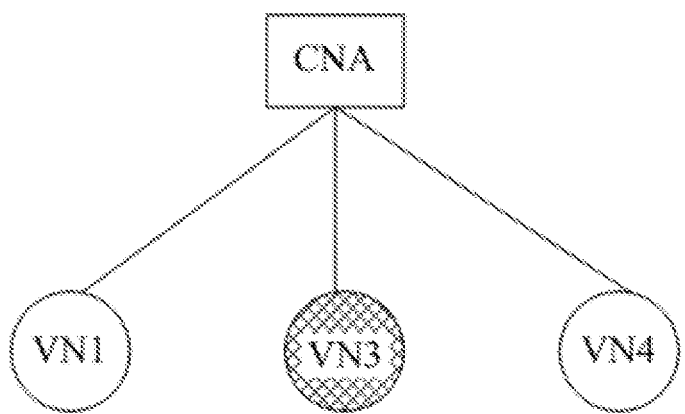
FIG. 4 is a schematic diagram of an example of a variable node, in a Tanner diagram, connected to a check node CNA according to the present invention.

As shown in FIG. 4, it is assumed that in a Tanner diagram corresponding to an LDPC code check matrix, a variable node connected to a check node CNA (Check Node A) includes a VN1 (Variable Node 1), a VN3, and a VN4. To improve a coding rate of the LDPC code, if during encoding, a parity bit corresponding to the variable node VN3 is punctured, when a receive end performs reverse puncturing decoding, 0 is assigned to an iterative decoding initial likelihood message of the variable node VN3, that is, an initial likelihood message of the VN3 does not provide any message that helps entire decoding restoration. In this case, during transmission of a decoding message, a value of a destructive update message received by the variable nodes VN1 and VN4 that are connected to the CNA and that are adjacent to the VN3 is 0, which leads to destructive impact on correct decoding of the VN1 and the VN4. In this case, if the variable node VN3 is punctured, a row destruction value of 2 (that is, a quantity of variable nodes in a row in which the check node CNA is located that are connected to the CNA and that are adjacent to the variable node VN3) is caused to the row in which the check node CNA in the LDPC code check matrix is located.

Second: For each variable node, the cycle destruction, on the LDPC code check matrix, of the variable node is used to measure impact of the variable node in the LDPC code check matrix on correct decoding of variable nodes traversed by a minimum cycle corresponding to the variable node.

The minimum cycle corresponding to the variable node is a closed figure, with a minimum length, formed by sequentially connecting the variable node to surrounding variable nodes and check nodes, where a length of the closed figure (that is, the formed minimum cycle) is a quantity of variable nodes and check nodes traversed by the closed figure.

Figure 5:
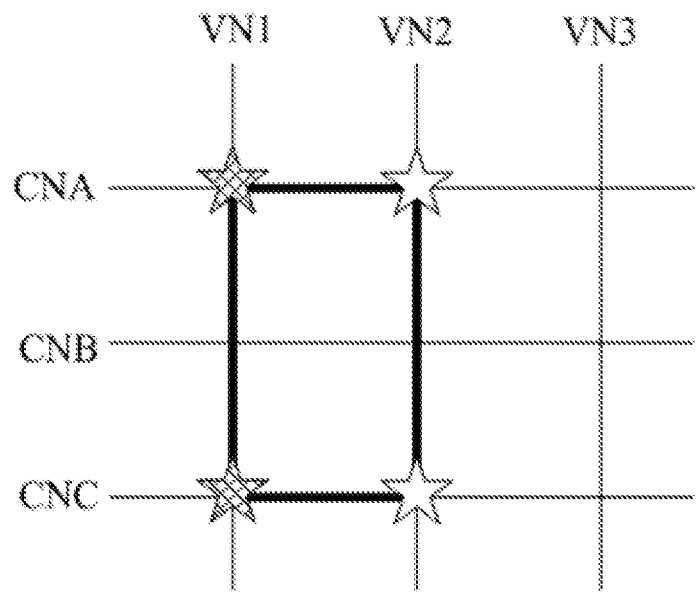
FIG. 5 is a schematic diagram of an example of a minimum cycle with a length of 4 in an LDPC code check matrix according to the present invention.

As shown in FIG. 5, the variable nodes VN1 and VN2 and the check nodes CNA and CNC form a cycle with a length of 4, as shown by thick lines in FIG. 5. In this case, if during encoding, a parity bit corresponding to the variable node VN1 is punctured, when a receive end performs reverse puncturing decoding, 0 is assigned to an iterative decoding initial likelihood message of the variable node VN1. As can be seen from FIG. 5, when updating a likelihood message in an iterative decoding process, the variable node VN2 receives a destruction message (that is, an updating message with a value of 0) transmitted by each of the check nodes CNA and CNC that are connected to the variable node VN1, which severely affects correct decoding of the variable node VN2. In addition, when a decoder performs iteration for a second time, the destructive likelihood message is transmitted back to the variable node VN1, which increases restoration difficulty of the VN1, and therefore, causes severely adverse impact to decoding performance.

Figure 6:
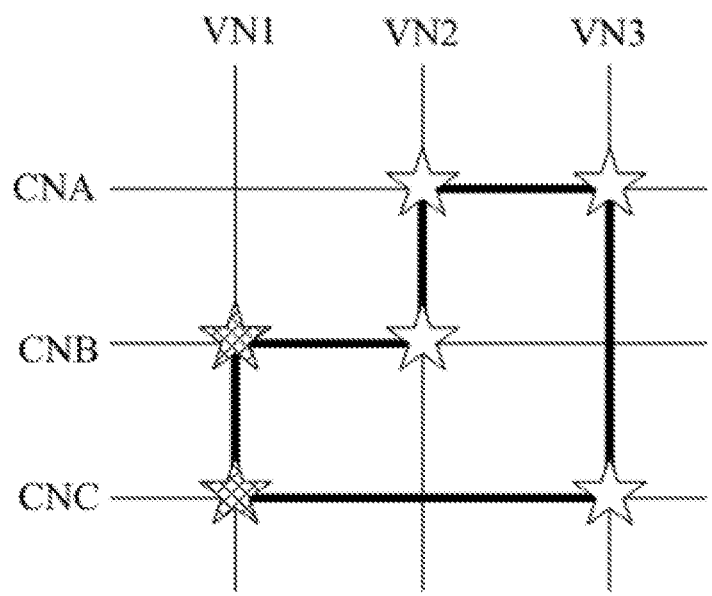
FIG. 6 is a schematic diagram of an example of a minimum cycle with a length of 6 in an LDPC code check matrix according to the present invention.

Further, as shown in FIG. 6, the variable nodes VN1, VN2, and VN3 and the check nodes CNA, CNB, and CNC form a cycle with a length of 6, as shown by thick lines in FIG. 6. In this case, if during encoding, a parity bit corresponding to the variable node VN1 is punctured, when a receive end performs reverse puncturing decoding, 0 is assigned to an iterative decoding initial likelihood message of the variable node VN1. When updating a likelihood message in an iterative decoding process, both the variable nodes VN2 and VN3 in the minimum cycle receive a destruction message (that is, an update message with a value of 0) transmitted by each of the check nodes CNA, CNB, and CNC, which severely affects correct decoding of the variable nodes VN2 and VN3 in the minimum cycle. In addition, when the decoder performs iteration for a third time, the destructive likelihood message is transmitted back to the VN1, which further affects decoding performance of the entire decoder. As can be seen from the foregoing analysis, a quantity of minimum cycles involved by a variable node corresponding to a punctured parity bit should be decreased as much as possible, so as to improve decoding performance of a punctured codeword.

Based on any one of the foregoing embodiments, for each parity bit in the codeword sequence, the row destruction, on the LDPC code check matrix, of the variable node corresponding to the parity bit is determined according to the following formula:

$$RowDestruction(i) = \sum_{m \in G_c(i)} D(m), \quad \text{formula 1}$$

where

RowDestruction(i) represents row destruction caused to the LDPC code check matrix by a variable node VN(i) corresponding to an $i^{th}$ parity bit in the codeword sequence, where i=1, 2, ..., N, and N represents a quantity of the parity bits in the codeword sequence; $G_C(i)$ represents a set of check nodes CN(m) connected to the variable node VN(i), where m=1, ..., M, and M represents a quantity of the check nodes connected to the variable node VN(i); and D(m) represents a quantity of variable nodes that are adjacent to the variable node VN(i) and that are of the variable nodes connected to the check node CN(m) in the LDPC code check matrix.

Figure 7:
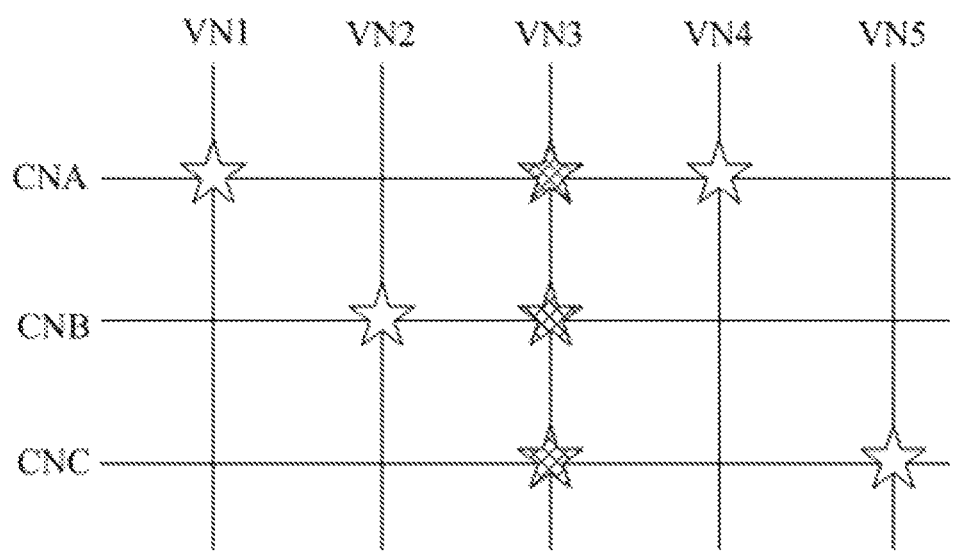
FIG. 7 is a schematic diagram of an example of determining row destruction of a variable node according to the present invention.

For example, as shown in FIG. 7, check nodes CNA, CNB, and CNC are connected to the variable node VN3. Therefore, during encoding, to improve a coding rate of an LDPC code, if the variable node VN3 is punctured, destruction of 2 is caused to a row in which the check node CNA in the LDPC code check matrix is located, destruction of 1 is caused to a row in which the check node CNB in the LDPC code check matrix is located, and destruction of 1 is caused to a row in which the check node CNC in the LDPC code check matrix is located. Therefore, if the variable node VN3 is punctured, destruction caused to the entire LDPC code check matrix is 2+1+1=4.

Based on any one of the foregoing embodiments, for each parity bit in the codeword sequence, the cycle destruction, on the LDPC code check matrix, of the variable node corresponding to the parity bit is determined according to the following formula:

$$\text{CycDestruction}(i) = \text{CycNum}(i) * S \quad \text{formula 2, where}$$

CycDestruction(i) represents cycle destruction caused to the LDPC code check matrix by a variable node VN(i) corresponding to an $i^{th}$ parity bit in the codeword sequence, where i=1, 2, ..., N, and N represents a quantity of the parity bits in the codeword sequence; CycNum(i) represents a quantity of minimum cycles formed by connecting the variable node VN(i) in the LDPC code check matrix to surrounding variable nodes and check nodes; and S is a specified optimization factor, and S>0.

For a value of the optimization factor S, simulation may be performed on puncturing performance according to performance of the LDPC code to obtain a value S with better performance. Optionally, the value of the optimization factor S is 2. By means of simulation, when the value of the optimization factor S is 2, good LDPC code performance can be obtained.

Based on any one of the foregoing embodiments, in step 32, the determining a puncturing priority of each parity bit in the codeword sequence according to row destruction and/or cycle destruction, on the LDPC code check matrix, of a variable node corresponding to each parity bit includes the following three optional implementation manners:

Manner 1: The puncturing priority of each parity bit in the codeword sequence is determined according to the row destruction, on the LDPC code check matrix, of the variable node corresponding to the parity bit.

In this manner, the determining a puncturing priority of each parity bit in the codeword sequence according to row destruction, on the LDPC code check matrix, of a variable node corresponding to each parity bit includes:

sequentially determining the puncturing priorities of the parity bits in the codeword sequence in ascending order of values of row destruction, on the LDPC code check matrix, of the variable nodes corresponding to the parity bits in the codeword sequence, where a puncturing priority of a parity bit corresponding to a variable node with a smaller row destruction value is lower than a puncturing priority of a parity bit corresponding to a variable node with a larger row destruction value.

In an implementation, parity bits corresponding to variable nodes with a same row destruction value have a same puncturing priority.

Optionally, the parity bits in the codeword sequence may be grouped into at least one set according to a value of the row destruction, on the LDPC code check matrix, of the variable node corresponding to each parity bit in the codeword sequence, where values of the row destruction, on the LDPC code check matrix, of variable nodes corresponding to the parity bits in each set are the same, that is, parity bits in a same set have a same puncturing priority.

In this manner, further, in step 33, the puncturing the codeword sequence according to the puncturing priority of each parity bit in the codeword sequence includes:

puncturing, in ascending order of the puncturing priorities of the parity bits in the codeword sequence, the codeword sequence according to the determined quantity of parity bits that need to be punctured.

The quantity of parity bits that need to be punctured during puncturing processing is known in advance, and may be determined according to parameters such as a coding rate and a code length, that need to be improved, of an LDPC code, which is the same as that in the prior art, and no further details are provided herein.

Specifically, when puncturing processing is performed, puncturing processing is performed, in ascending order of the puncturing priorities of the parity bits in the codeword sequence, on the codeword sequence according to the quantity of parity bits that need to be punctured. That is, a parity bit with a low puncturing priority in the codeword sequence is first punctured, until the quantity of parity bits that need to be punctured is reached.

In an implementation, parity bits with a same puncturing priority (that is, parity bits included in a same set) are randomly selected for puncturing.

Manner 2: The puncturing priority of each parity bit in the codeword sequence is determined according to the cycle destruction, on the LDPC code check matrix, of the variable node corresponding to the parity bit.

In this manner, the determining a puncturing priority of each parity bit in the codeword sequence according to cycle destruction of a variable node, on the LDPC code check matrix, corresponding to each parity bit includes:

sequentially determining the puncturing priorities of the parity bits in the codeword sequence in ascending order of values of cycle destruction, on the LDPC code check matrix, of the variable nodes corresponding to the parity bits in the codeword sequence, where a puncturing priority of a parity bit corresponding to a variable node with a smaller cycle destruction value is lower than a puncturing priority of a parity bit corresponding to a variable node with a larger cycle destruction value.

In an implementation, parity bits corresponding to variable nodes with a same cycle destruction value have a same puncturing priority.

Optionally, the parity bits in the codeword sequence may be grouped into at least one set according to a value of the cycle destruction, on the LDPC code check matrix, of the variable node corresponding to each parity bit in the codeword sequence, where values of the cycle destruction, on the LDPC code check matrix, of variable nodes corresponding to the parity bits in each set are the same, that is, parity bits in a same set have a same puncturing priority.

In this manner, further, in step 33, the puncturing the codeword sequence according to the puncturing priority of each parity bit in the codeword sequence includes:

puncturing, in ascending order of the puncturing priorities of the parity bits in the codeword sequence, the codeword sequence according to the determined quantity of parity bits that need to be punctured.

Specifically, when puncturing processing is performed, puncturing processing is performed, in ascending order of the puncturing priorities of the parity bits in the codeword sequence, on the codeword sequence according to the quantity of parity bits that need to be punctured. That is, a parity bit with a low puncturing priority in the codeword sequence is first punctured, until the quantity of parity bits that need to be punctured is reached.

In an implementation, parity bits with a same puncturing priority (that is, parity bits included in a same set) are randomly selected for puncturing.

Manner 3: The puncturing priority of each parity bit in the codeword sequence is determined according to the row destruction and the cycle destruction, on the LDPC code check matrix, of the variable node corresponding to the parity bit.

In this manner, the determining a puncturing priority of each parity bit in the codeword sequence according to row destruction and cycle destruction, on the LDPC code check matrix, of a variable node corresponding to each parity bit includes:

for each parity bit in the codeword sequence, performing summation on the row destruction and the cycle destruction, on the LDPC code check matrix, of the variable node corresponding to the parity bit, and using an obtained sum value as total destruction, on the LDPC code check matrix, of the variable node corresponding to the parity bit, that is, SumDestruction(i)=RowDestruction(i)+CycDestruction(i); and sequentially determining the puncturing priorities of the parity bits in the codeword sequence in ascending order of values of total destruction, on the LDPC code check matrix, of the variable nodes corresponding to the parity bits in the codeword sequence, where a puncturing priority of a parity bit corresponding to a variable node with a smaller total destruction value is lower than a puncturing priority of a parity bit corresponding to a variable node with a larger total destruction value.

In an implementation, parity bits corresponding to variable nodes with a same total destruction value have a same puncturing priority.

Optionally, the parity bits in the codeword sequence may be grouped into at least one set according to a value of the total destruction, on the LDPC code check matrix, of the variable node corresponding to each parity bit in the codeword sequence, where values of the total destruction, on the LDPC code check matrix, of variable nodes corresponding to the parity bits in each set are the same, that is, parity bits in a same set have a same puncturing priority.

For example, these parity bits are grouped into sets according to total destruction values, where total destruction values corresponding to all parity bits in each set are equal. It is assumed that all to-be-punctured parity bits may be grouped into sets Set(1), . . . , and Set(J), and meet:

$$\text{SumDestruction}_{Set(1)} < \text{SumDestruction}_{Set(2)} < \ldots < \text{SumDestruction}_{Set(J)}.$$

In this manner, further, in step 33, the puncturing the codeword sequence according to the puncturing priority of each parity bit in the codeword sequence includes:

determining, in the codeword sequence, a quantity of parity bits that need to be punctured; and puncturing, in ascending order of the puncturing priorities of the parity bits in the codeword sequence, the codeword sequence according to the determined quantity of parity bits that need to be punctured.

Specifically, when puncturing processing is performed, puncturing processing is performed, in ascending order of the puncturing priorities of the parity bits in the codeword sequence, on the codeword sequence according to the determined quantity of parity bits that need to be punctured. That is, a parity bit with a low puncturing priority in the codeword sequence is first punctured, until the quantity of parity bits that need to be punctured is reached.

In an implementation, parity bits with a same puncturing priority (that is, parity bits included in a same set) are randomly selected for puncturing.

Using the foregoing parity bits that are grouped into sets as an example, the parity bits in each set may be punctured in ascending order of the total destruction values, that is, parity bits in the set Set(1) are preferentially punctured, then parity bits in the set Set(2) are punctured, and puncturing is performed in this order, until a required coding rate of the LDPC code is obtained.

With reference to the following three embodiments, using manner 3 as an example, the following describes the puncturing manner in the data sending method provided in the present invention.

Embodiment 1

For an LDPC code, used in the existing WLAN standard, with a code length of N=648 bits and a coding rate of R=½, an LDPC code check matrix H of the LDPC code is formed by 27×27 cyclic shift square matrixes. According to the puncturing method provided in the present invention, variable nodes corresponding to parity bits in the check matrix are grouped into sets, and may be grouped into seven sets, which are specifically shown in Table 1:

TABLE 1

|  | Set(1) | Set(2) | Set(3) | Set(4) | Set(5) | Set(6) | Set(7) |
| --- | --- | --- | --- | --- | --- | --- | --- |
| SumDestruction value | 74 | 78 | 85 | 87 | 89 | 93 | 108 |
| Quantity of parity bits in a set | 27 | 54 | 108 | 27 | 54 | 27 | 27 |

If a coding rate of the LDPC code needs to be improved to R'=⅔, 162 parity bits need to be punctured. According to the method provided in the present invention, parity bits that need to be punctured are all parity bits in the set Set(1) and the set Set(2), and 81 parity bits in the set Set(3) (which are equivalent to parity bits corresponding to three 27-dimensional submatrix blocks), where 81 parity bits are randomly selected from the set Set(3) for puncturing.

If a coding rate of the LDPC code needs to be improved to R'=¾, 216 parity bits need to be punctured. According to the method provided in the present invention, parity bits that need to be punctured are all parity bits in the set Set(1), the set Set(2), the set Set(3), and the set Set(4).

If a coding rate of the LDPC code needs to be improved to R'=⅚, 259 parity bits need to be punctured. According to the method provided in the present invention, parity bits that need to be punctured are all parity bits in the set Set(1), the set Set(2), the set Set(3), and the set Set(4), and 43 parity bits in the set Set(5), where 43 parity bits are randomly selected from the set Set(5) for puncturing.

Figure 8:
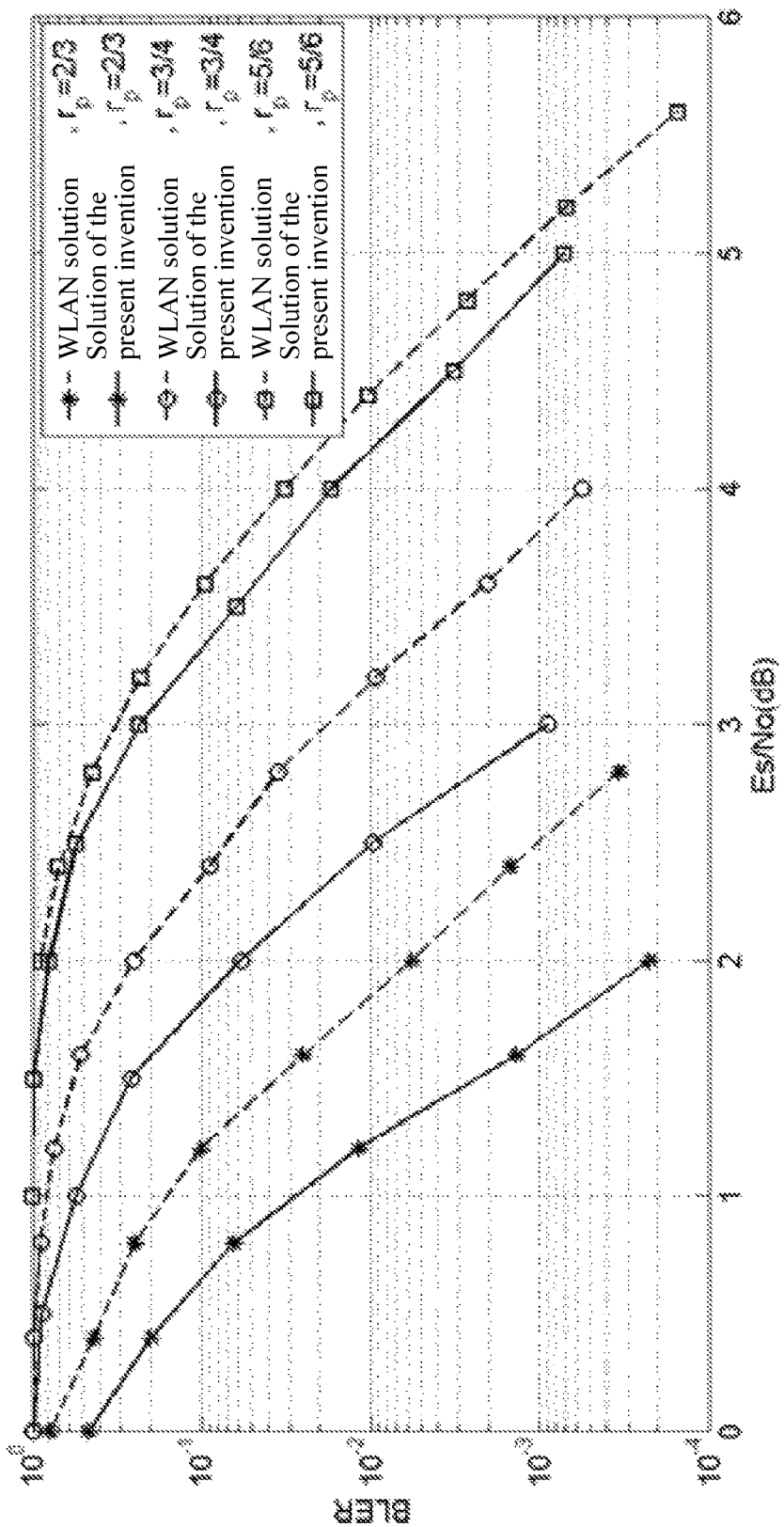
FIG. 8 is a schematic diagram of a simulation result of Embodiment 1 according to the present invention.

FIG. 8 shows a simulation result, when a code length is 648, of LDPC code performance obtained after puncturing is performed by using the puncturing method provided in the present invention and LDPC code performance obtained after puncturing is performed by using the existing puncturing method, that is, performance comparison of block error rates (Block Error Rate, BLER). Each channel used in the simulation process is an additive white Gaussian noise (Additive White Gaussian Noise, AWGN) channel, each modulation manner is binary phase shift keying (Binary Phase Shift Keying, BPSK), each decoding algorithm is a log-likelihood ratio-belief propagation (Log-Likelihood Ratio-Belief Propagation, LLR-BP) algorithm, and each maximum quantity of iterative decoding times is 50 times. As can be seen from FIG. 8, when the code length is 648, at each coding rate, the LDPC code performance obtained after puncturing in this embodiment is better than the LDPC code performance obtained after puncturing is performed by using the existing puncturing method.

Embodiment 2

For an LDPC code, used in the existing WLAN standard, with a code length of N=1296 bits and a coding rate of R=½, an LDPC code check matrix H of the LDPC code is formed by 54×54 cyclic shift square matrixes. According to the puncturing method provided in the present invention, variable nodes corresponding to parity bit parts in the check matrix are grouped into sets, and may be grouped into seven sets, which are specifically shown in Table 2:

TABLE 2

|  | Set(1) | Set(2) | Set(3) | Set(4) | Set(5) | Set(6) | Set(7) |
| --- | --- | --- | --- | --- | --- | --- | --- |
| SumDestruction value | 72 | 74 | 76 | 85 | 87 | 89 | 112 |
| Quantity of parity bits in a set | 54 | 216 | 108 | 54 | 108 | 54 | 54 |

If a coding rate of the LDPC code needs to be improved to $R'=⅔$, 324 parity bits need to be punctured. According to the puncturing method provided in the present invention, parity bits that need to be punctured are all parity bits in the set Set(1) and the set Set(2), and 54 parity bits in the set Set(3) (which are equivalent to parity bits corresponding to one 54-dimensional submatrix block), where 54 parity bits are randomly selected from the set Set(3) for puncturing.

If a coding rate of the LDPC code needs to be improved to $R'=¾$, 432 parity bits need to be punctured. According to the puncturing method provided in the present invention, parity bits that need to be punctured are all parity bits in the set Set(1), the set Set(2), the set Set(3), and the set Set(4).

If a coding rate of the LDPC code needs to be improved to $R'=⅚$, 518 parity bits need to be punctured. According to the puncturing method provided in the present invention, parity bits that need to be punctured are all parity bits in the set Set(1), the set Set(2), the set Set(3), and the set Set(4), and 86 parity bits in the Set(5), where 86 parity bits are randomly selected from the set Set(5) for puncturing.

Figure 9:
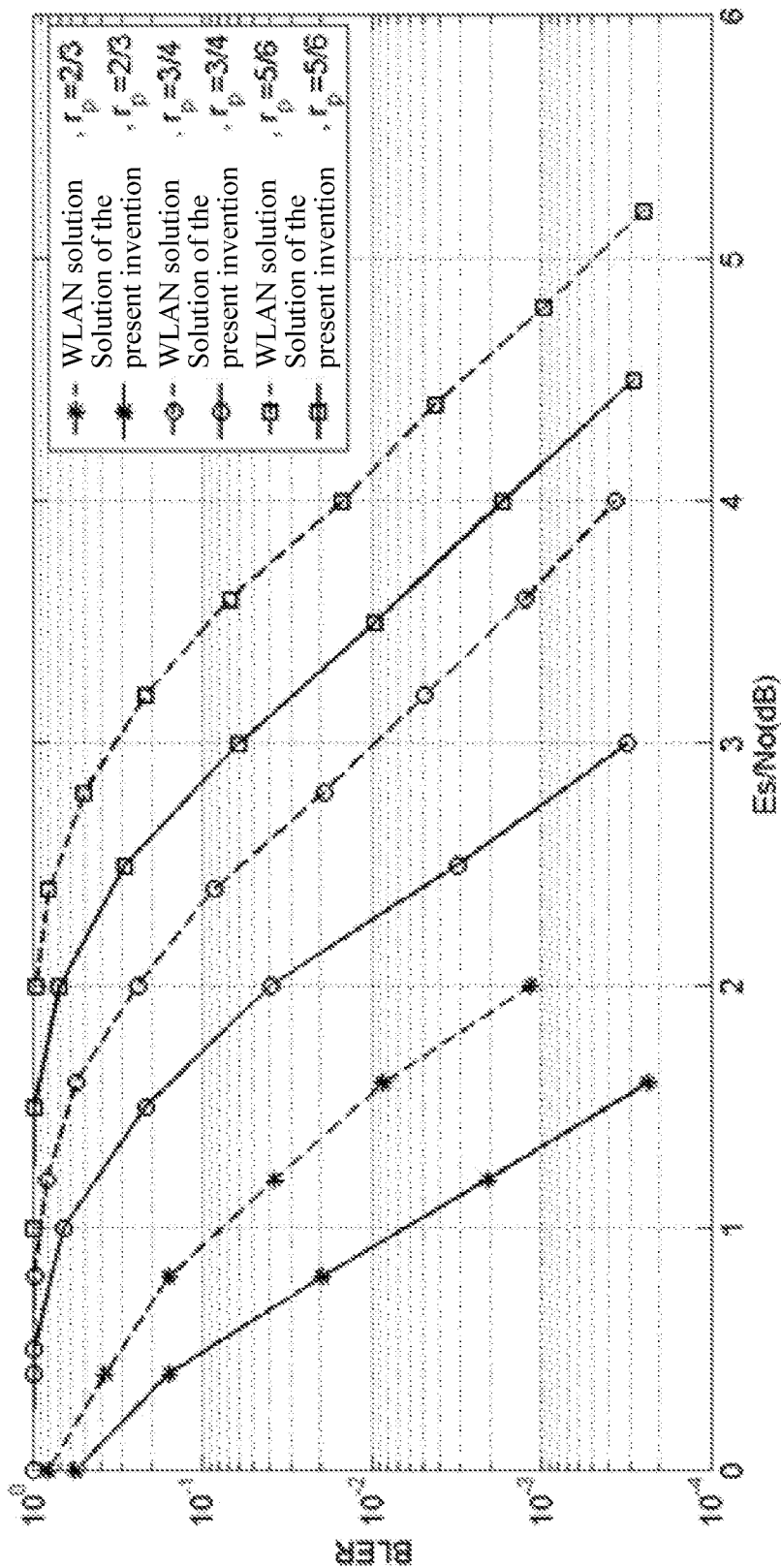
FIG. 9 is a schematic diagram of a simulation result of Embodiment 2 according to the present invention.

FIG. 9 shows a simulation result, when a code length is 1296, of LDPC code performance obtained after puncturing is performed by using the puncturing method provided in the present invention and LDPC code performance obtained after puncturing is performed by using the existing puncturing method, that is, performance comparison of block error rates (Block Error Rate, BLER). Each channel used in the simulation process is an AWGN channel, each modulation manner is BPSK, each decoding algorithm is an LLR-BP algorithm, and each maximum quantity of iterative decoding times is 50 times. As can be seen from FIG. 9, when the code length is 1296, at each coding rate, the LDPC code performance obtained after puncturing in this embodiment is better than the LDPC code performance obtained after puncturing is performed by using the existing puncturing method.

Embodiment 3

For an LDPC code, used in the existing WLAN standard, with a code length of N=1944 bits and a coding rate of R=½, a check matrix H of the LDPC code is formed by 81×81 cyclic shift square matrixes. According to the puncturing method provided in the present invention, variable nodes corresponding to parity bit parts in the matrix are grouped into sets, and may be grouped into six sets, which are specifically shown in Table 3:

TABLE 3

|  | Set(1) | Set(2) | Set(3) | Set(4) | Set(5) | Set(6) |
| --- | --- | --- | --- | --- | --- | --- |
| SumDestruction value | 72 | 74 | 76 | 87 | 89 | 142 |
| Quantity of parity bits in a set | 243 | 243 | 162 | 162 | 81 | 81 |

If a coding rate of the LDPC code needs to be improved to $R'=⅔$, 486 parity bits need to be punctured. According to the puncturing method provided in the present invention, parity bits that need to be punctured are all parity bits in the set Set(1) and the set Set(2).

If a coding rate of the LDPC code needs to be improved to $R'=¾$, 648 parity bits need to be punctured. According to the puncturing method provided in the present invention, parity bits that need to be punctured are all parity bits in the set Set(1), the set Set(2), and the set Set(3).

If a coding rate of the LDPC code needs to be improved to $R'=⅚$, 778 parity bits need to be punctured. According to the puncturing method provided in the present invention, parity bits that need to be punctured are all parity bits in the set Set(1), the set Set(2), and the set Set(3), and 130 parity bits in the Set(4), where 130 parity bits are randomly selected from the set Set(4) for puncturing.

Figure 10:
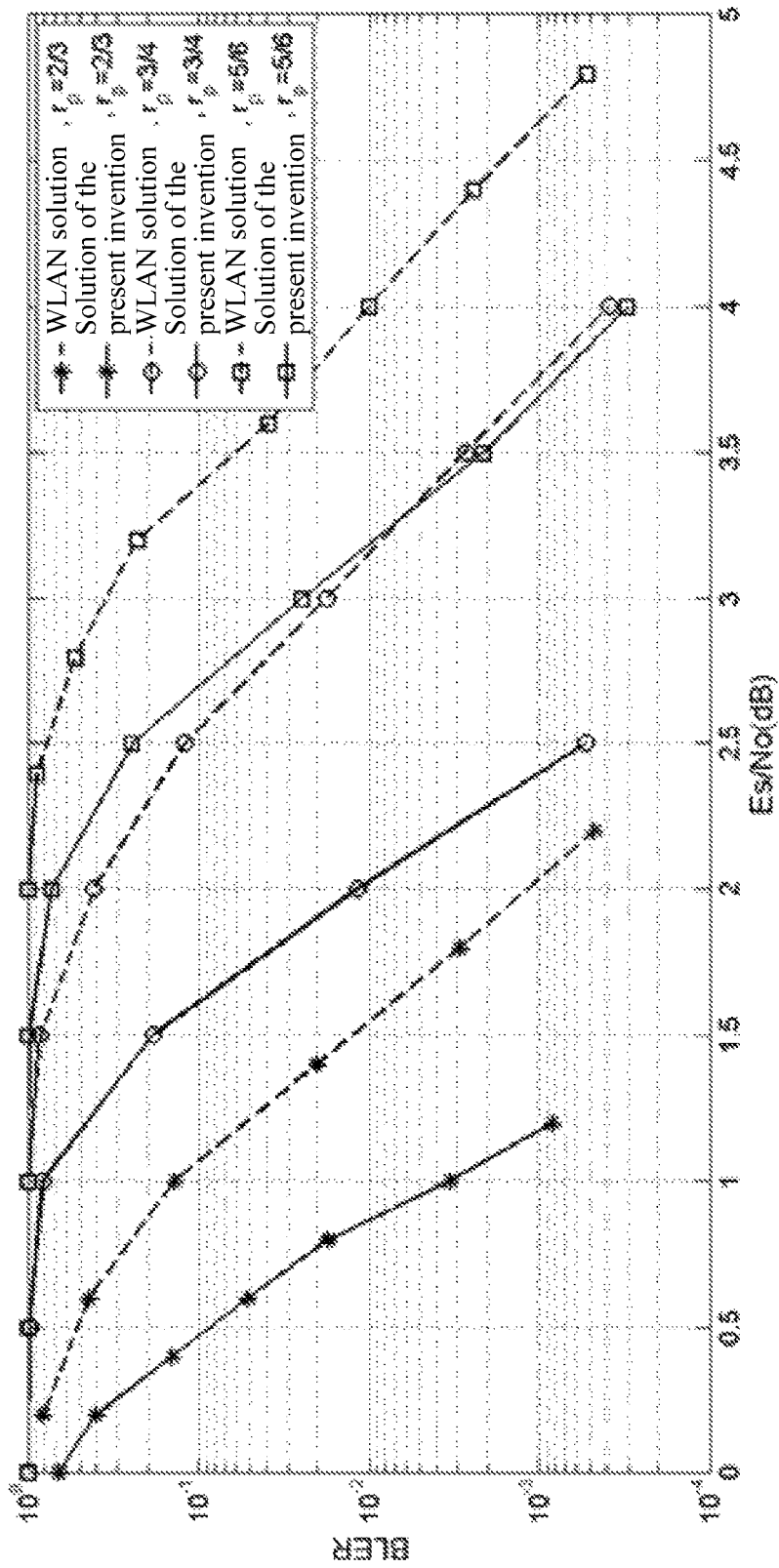
FIG. 10 is a schematic diagram of a simulation result of Embodiment 3 according to the present invention.

FIG. 10 shows a simulation result, when a code length is 1944, of LDPC code performance obtained after puncturing is performed by using the puncturing method provided in the present invention and LDPC code performance obtained after puncturing is performed by using the existing puncturing method, that is, performance comparison of block error rates (Block Error Rate, BLER). Each channel used in the simulation process is an AWGN channel, each modulation manner is BPSK, each decoding algorithm is an LLR-BP algorithm, and each maximum quantity of iterative decoding times is 50 times. As can be seen from FIG. 10, when the code length is 1944, at each coding rate, the LDPC code performance obtained after puncturing in this embodiment is better than the LDPC code performance obtained after puncturing is performed by using the existing puncturing method.

Based on the foregoing three embodiments, data in the foregoing simulation result is transformed into a table form, and when the BLER is $1.0\times10^{-2}$, compared with a WLAN puncturing method, gains of the puncturing method provided in the present invention are shown in Table 4:

TABLE 4

|  | Coding rate of 2/3 | Coding rate of 3/4 | Coding rate of 5/6 |
| --- | --- | --- | --- |
| Code length of 648 | 0.6 | 0.7 | 0.2 |
| Code length of 1296 | 0.6 | 0.7 | 0.6 |
| Code length of 1944 | 0.7 | 1.1 | 0.8 |

As can be seen from Table 4, compared with the LDPC code puncturing method in the existing WLAN standard, the puncturing method provided in the present invention is obviously enhanced in performance. In addition, because a check matrix used in a standard is fixed, a puncturing pattern may be determined in advance according to the puncturing method provided in the present invention, so that hardware complexity is not increased. Therefore, the puncturing method provided in the present invention has relatively strong competitive strength.

The foregoing method processing procedures may be implemented by using a software program, where the software program may be stored in a storage medium. When the stored software program is invoked, the foregoing method steps are performed.

Figure 11:
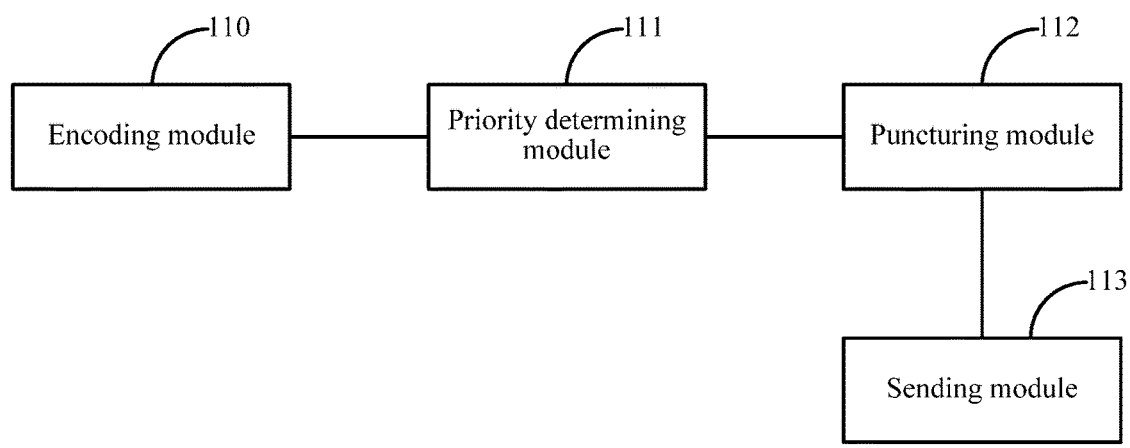
FIG. 11 is a schematic structural diagram of a data sending apparatus according to the present invention.

Based on a same invention concept, the present invention provides a data sending apparatus. A structure of the apparatus is shown in FIG. 11, and the apparatus includes:

an encoding module 110, configured to encode, by using an LDPC code check matrix, an information bit that needs to be sent, to obtain a codeword sequence, where the codeword sequence includes the information bit and parity bits;

a priority determining module 111, configured to determine a puncturing priority of each parity bit in the codeword sequence according to row destruction and/or cycle destruction, on the LDPC code check matrix, of a variable node corresponding to each parity bit;

a puncturing module 112, configured to puncture the codeword sequence according to the puncturing priority of each parity bit in the codeword sequence; and a sending module 113, configured to: generate a bit sequence according to the punctured codeword sequence, and send the bit sequence, where the row destruction is used to measure impact of the variable node in the LDPC code check matrix on correct decoding of variable nodes adjacent to the variable node, where the adjacent variable nodes are variable nodes that are adjacent to the variable node and that are of variable nodes connected to check nodes connected to the variable node; and the cycle destruction is used to measure impact of the variable node in the LDPC code check matrix on correct decoding of variable nodes traversed by a minimum cycle corresponding to the variable node, where the minimum cycle corresponding to the variable node is a closed figure, with a minimum length, formed by connecting the variable node to surrounding variable nodes and check nodes.

In an implementation, for each parity bit in the codeword sequence, the priority determining module 111 determines the row destruction, on the LDPC code check matrix, of the variable node corresponding to the parity bit according to the following formula:

$$RowDestruction(i) = \sum_{m \in G_C(i)} D(m),$$

where

RowDestruction(i) represents row destruction caused to the LDPC code check matrix by a variable node VN(i) corresponding to an $i^{th}$ parity bit in the codeword sequence, where i=1, 2, . . . , N, and N represents a quantity of the parity bits in the codeword sequence; $G_C(i)$ represents a set of check nodes CN(m) connected to the variable node VN(i), where m=1, . . . , M, and M represents a quantity of the check nodes connected to the variable node VN(i); and D(m) represents a quantity of variable nodes that are adjacent to the variable node VN(i) and that are of the variable nodes connected to the check node CN(m) in the LDPC code check matrix.

Further, in a first optional implementation manner, the priority determining module 111 is specifically configured to:

sequentially determine the puncturing priorities of the parity bits in the codeword sequence in ascending order of values of row destruction, on the LDPC code check matrix, of the variable nodes corresponding to the parity bits in the codeword sequence, where a puncturing priority of a parity bit corresponding to a variable node with a smaller row destruction value is lower than a puncturing priority of a parity bit corresponding to a variable node with a larger row destruction value.

In an implementation, for each parity bit in the codeword sequence, the priority determining module 111 determines the cycle destruction, on the LDPC code check matrix, of the variable node corresponding to the parity bit according to the following formula:

$$CycDestruction(i) = CycNum(i)*S, \text{ where}$$

CycDestruction(i) represents cycle destruction caused to the LDPC code check matrix by a variable node VN(i) corresponding to an $i^{th}$ parity bit in the codeword sequence, where i=1, 2, . . . , N, and N represents a quantity of the parity bits in the codeword sequence; CycNum(i) represents a quantity of minimum cycles formed by connecting the variable node VN(i) in the LDPC code check matrix to surrounding variable nodes and check nodes; and S is a specified optimization factor, and S>0.

Further, in a second optional implementation manner, the priority determining module 111 is specifically configured to:

sequentially determine the puncturing priorities of the parity bits in the codeword sequence in ascending order of values of cycle destruction, on the LDPC code check matrix, of the variable nodes corresponding to the parity bits in the codeword sequence, where a puncturing priority of a parity bit corresponding to a variable node with a smaller cycle destruction value is lower than a puncturing priority of a parity bit corresponding to a variable node with a larger cycle destruction value.

Based on any one of the foregoing embodiments, in a third optional implementation manner, the priority determining module 111 is specifically configured to:

for each parity bit in the codeword sequence, perform summation on the row destruction and the cycle destruction, on the LDPC code check matrix, of the variable node corresponding to the parity bit, and use an obtained sum value as total destruction, on the LDPC code check matrix, of the variable node corresponding to the parity bit; and sequentially determine the puncturing priorities of the parity bits in the codeword sequence in ascending order of values of total destruction, on the LDPC code check matrix, of the variable nodes corresponding to the parity bits in the codeword sequence, where a puncturing priority of a parity bit corresponding to a variable node with a smaller total destruction value is lower than a puncturing priority of a parity bit corresponding to a variable node with a larger total destruction value.

Based on any one of the foregoing embodiments, the puncturing module 112 is specifically configured to:

determine, in the codeword sequence, a quantity of parity bits that need to be punctured; and puncture, in ascending order of the puncturing priorities of the parity bits in the codeword sequence, the codeword sequence according to the determined quantity of parity bits that need to be punctured.

According to the data sending apparatus provided in the present invention, a puncturing priority corresponding to each parity bit in a codeword sequence is determined by using row destruction and/or cycle destruction, on an LDPC code check matrix, of a variable node corresponding to each parity bit, and the codeword sequence is punctured according to the puncturing priority corresponding to each parity bit in the codeword sequence, so that parity bits of LDPC codes in a WLAN standard can be effectively distinguished, thereby improving performance of an obtained high coding rate LDPC code, and also improving error control performance of the LDPC code.

Figure 12:
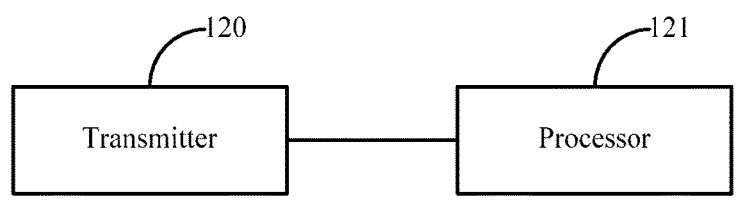
FIG. 12 is a schematic structural diagram of a communications device according to the present invention.

Based on a same invention concept, the present invention further provides a communications device. A structure of the communications device is shown in FIG. 12, and the communications device includes a transmitter 120 and a processor 121, where:

the processor 121 is configured to: encode, by using an LDPC code check matrix, an information bit that needs to be sent, to obtain a codeword sequence, where the codeword sequence includes the information bit and parity bits; determine a puncturing priority of each parity bit in the codeword sequence according to row destruction and/or cycle destruction, on the LDPC code check matrix, of a variable node corresponding to each parity bit; puncture the codeword sequence according to the puncturing priority of each parity bit in the codeword sequence; and generate a bit sequence according to the punctured codeword sequence; and the transmitter 120 is configured to send the bit sequence generated by the processor 121, where the row destruction is used to measure impact of the variable node in the LDPC code check matrix on correct decoding of variable nodes adjacent to the variable node, where the adjacent variable nodes are variable nodes that are adjacent to the variable node and that are of variable nodes connected to check nodes connected to the variable node; and the cycle destruction is used to measure impact of the variable node in the LDPC code check matrix on correct decoding of variable nodes traversed by a minimum cycle corresponding to the variable node, where the minimum cycle corresponding to the variable node is a closed figure, with a minimum length, formed by connecting the variable node to surrounding variable nodes and check nodes.

The transmitter 120 and the processor 121 in the communications device provided in the present invention are connected by using a bus.

In an implementation, for each parity bit in the codeword sequence, the processor 121 determines the row destruction, on the LDPC code check matrix, of the variable node corresponding to the parity bit according to the following formula:

$$RowDestruction(i) = \sum_{m \in G_C(i)} D(m),$$

where

RowDestruction(i) represents row destruction caused to the LDPC code check matrix by a variable node VN(i) corresponding to an $i^{th}$ parity bit in the codeword sequence, where i=1, 2, ..., N and N represents a quantity of the parity bits in the codeword sequence; $G_C(i)$ represents a set of check nodes VN(i) connected to the variable node CN(m), where m=1, ..., M, and M represents a quantity of the check nodes connected to the variable node VN(i); and D(m) represents a quantity of variable nodes that are adjacent to the variable node VN(i) and that are of the variable nodes connected to the check node CN(m) in the LDPC code check matrix.

Further, in a first optional implementation manner, the processor 121 is specifically configured to:

sequentially determine the puncturing priorities of the parity bits in the codeword sequence in ascending order of values of row destruction, on the LDPC code check matrix, of the variable nodes corresponding to the parity bits in the codeword sequence, where a puncturing priority of a parity bit corresponding to a variable node with a smaller row destruction value is lower than a puncturing priority of a parity bit corresponding to a variable node with a larger row destruction value.

In an implementation, for each parity bit in the codeword sequence, the processor 121 determines the cycle destruction, on the LDPC code check matrix, of the variable node corresponding to the parity bit according to the following formula:

$$CycDestruction(i) = CycNum(i) * S \text{ where}$$

CycDestruction(i) represents cycle destruction caused to the LDPC code check matrix by a variable node VN(i) corresponding to an $i^{th}$ parity bit in the codeword sequence, where i=1, 2, ..., N, and N represents a quantity of the parity bits in the codeword sequence; CycNum(i) represents a quantity of minimum cycles formed by connecting the variable node VN(i) in the LDPC code check matrix to surrounding variable nodes and check nodes; and S is a specified optimization factor, and S>0.

Further, in a second optional implementation manner, the processor 121 is specifically configured to:

sequentially determine the puncturing priorities of the parity bits in the codeword sequence in ascending order of values of cycle destruction, on the LDPC code check matrix, of the variable nodes corresponding to the parity bits in the codeword sequence, where a puncturing priority of a parity bit corresponding to a variable node with a smaller cycle destruction value is lower than a puncturing priority of a parity bit corresponding to a variable node with a larger cycle destruction value.

Based on any one of the foregoing embodiments, in a third optional implementation manner, the processor 121 is specifically configured to:

for each parity bit in the codeword sequence, perform summation on the row destruction and the cycle destruction, on the LDPC code check matrix, of the variable node corresponding to the parity bit, and use an obtained sum value as total destruction, on the LDPC code check matrix, of the variable node corresponding to the parity bit; and sequentially determine the puncturing priorities of the parity bits in the codeword sequence in ascending order of values of total destruction, on the LDPC code check matrix, of the variable nodes corresponding to the parity bits in the codeword sequence, where a puncturing priority of a parity bit corresponding to a variable node with a smaller total destruction value is lower than a puncturing priority of a parity bit corresponding to a variable node with a larger total destruction value.

Based on any one of the foregoing embodiments, the processor 121 is specifically configured to:

determine, in the codeword sequence, a quantity of parity bits that need to be punctured; and puncture, in ascending order of the puncturing priorities of the parity bits in the codeword sequence, the codeword sequence according to the determined quantity of parity bits that need to be punctured.

According to the communications device provided in the present invention, a puncturing priority corresponding to each parity bit in a codeword sequence is determined by using row destruction and/or cycle destruction, on an LDPC code check matrix, of a variable node corresponding to each parity bit, and the codeword sequence is punctured according to the puncturing priority corresponding to each parity bit in the codeword sequence, so that parity bits of LDPC codes in a WLAN standard can be effectively distinguished, thereby improving performance of an obtained high coding rate LDPC code, and also improving error control performance of the LDPC code.

A person skilled in the art should understand that the embodiments of the present invention may be provided as a method, a system, or a computer program product. Therefore, the present invention may use a form of hardware only embodiments, software only embodiments, or embodiments with a combination of software and hardware. Moreover, the present invention may use a form of a computer program product that is implemented on one or more computer-usable storage media (including but not limited to a disk memory, a CD-ROM, an optical memory, and the like) that include computer-usable program code.

The present invention is described with reference to the flowcharts and/or block diagrams of the method, the device (system), and the computer program product according to the embodiments of the present invention. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine, so that the instructions executed by a computer or a processor of any other programmable data processing device generate an apparatus for implementing a specific function in one or more processes in the flowcharts and/or in one or more blocks in the block diagrams.

These computer program instructions may also be stored in a computer readable memory that can instruct the computer or any other programmable data processing device to work in a specific manner, so that the instructions stored in the computer readable memory generate an artifact that includes an instruction apparatus. The instruction apparatus implements a specific function in one or more processes in the flowcharts and/or in one or more blocks in the block diagrams.

These computer program instructions may also be loaded onto a computer or another programmable data processing device, so that a series of operations and steps are performed on the computer or the another programmable device, thereby generating computer-implemented processing. Therefore, the instructions executed on the computer or the another programmable device provide steps for implementing a specific function in one or more processes in the flowcharts and/or in one or more blocks in the block diagrams.

Although some preferred embodiments of the present invention have been described, persons skilled in the art can make changes and modifications to these embodiments once they learn the basic inventive concept. Therefore, the following claims are intended to be construed as to cover the exemplary embodiments and all changes and modifications falling within the scope of the present invention.

Obviously, a person skilled in the art can make various modifications and variations to the present invention without departing from the spirit and scope of the present invention. The present invention is intended to cover these modifications and variations provided that they fall within the scope of protection defined by the following claims and their equivalent technologies.

What is claimed is:

1. A method of sending data in a wireless communication system, the method comprising:
    encoding, by a processor, by using a low density parity check (LDPC) code check matrix, an information bit to be sent in the wireless communication system, to obtain a codeword sequence, wherein the codeword sequence comprises the information bit and parity bits;
    determining, by the processor, a puncturing priority of each parity bit in the codeword sequence according to at least one of row destruction and cycle destruction, on the LDPC code check matrix, of a variable node of the wireless communication system corresponding to each parity bit;
    puncturing, by the processor, the codeword sequence according to the puncturing priority of each parity bit in the codeword sequence; and
    generating, by a transmitter in communication with the processor, a bit sequence according to the punctured codeword sequence, and sending, by the transmitter, the bit sequence in the wireless communication system, wherein
    the row destruction is used to measure impact of the variable node in the LDPC code check matrix on correct decoding of variable nodes of the wireless communication system adjacent to the variable node, wherein the adjacent variable nodes are variable nodes that are adjacent to the variable node and that are of variable nodes connected to check nodes of the wireless communication system connected to the variable node; and the cycle destruction is used to measure impact of the variable node in the LDPC code check matrix on correct decoding of variable nodes traversed by a minimum cycle corresponding to the variable node, wherein the minimum cycle corresponding to the variable node is a closed figure, with a minimum length, formed by connecting the variable node to surrounding variable nodes and check nodes.

2. The method according to claim 1, wherein for each parity bit in the codeword sequence, the row destruction, on the LDPC code check matrix, of the variable node corresponding to the parity bit is determined according to the following formula:

$$RowDestruction(i) = \sum_{m \in G_c(i)} D(m),$$

wherein

RowDestruction(i) represents row destruction caused to the LDPC code check matrix by a variable node VN(i) corresponding to an $i^{th}$ parity bit in the codeword sequence, wherein i=1, 2, L, N and N represents a quantity of the parity bits in the codeword sequence; $G_c(i)$ represents a set of check nodes CN(m) connected to the variable node VN(i), wherein m=1, K, M and M represents a quantity of the check nodes connected to the variable node VN(i); and D(m) represents a quantity of variable nodes that are adjacent to the variable node VN(i) and that are of the variable nodes connected to the check node CN(m) in the LDPC code check matrix.

3. The method according to claim 2, wherein the determining a puncturing priority of each parity bit in the codeword sequence according to row destruction, on the LDPC code check matrix, of a variable node corresponding to each parity bit comprises:

sequentially determining the puncturing priorities of the parity bits in the codeword sequence in ascending order of values of row destruction, on the LDPC code check matrix, of the variable nodes corresponding to the parity bits in the codeword sequence, wherein a puncturing priority of a parity bit corresponding to a variable node with a smaller row destruction value is lower than a puncturing priority of a parity bit corresponding to a variable node with a larger row destruction value.

4. The method according to claim 1, wherein for each parity bit in the codeword sequence, the cycle destruction, on the LDPC code check matrix, of the variable node corresponding to the parity bit is determined according to the following formula:

CycDestruction(i)=CycNum(i)*S, wherein

CycDestruction(i) represents cycle destruction caused to the LDPC code check matrix by a variable node VN(i) corresponding to an $i^{th}$ parity bit in the codeword sequence, wherein i=1, 2, L, N and N represents a quantity of the parity bits in the codeword sequence; CycNum(i) represents a quantity of minimum cycles formed by connecting the variable node VN(i) in the LDPC code check matrix to surrounding variable nodes and check nodes; and S is a specified optimization factor, and S>0.

5. The method according to claim 4, wherein the determining a puncturing priority of each parity bit in the codeword sequence according to cycle destruction, on the LDPC code check matrix, of a variable node corresponding to each parity bit comprises:

sequentially determining the puncturing priorities of the parity bits in the codeword sequence in ascending order of values of cycle destruction, on the LDPC code check matrix, of the variable nodes corresponding to the parity bits in the codeword sequence, wherein a puncturing priority of a parity bit corresponding to a variable node with a smaller cycle destruction value is lower than a puncturing priority of a parity bit corresponding to a variable node with a larger cycle destruction value.

6. The method according to claim 1, wherein the determining a puncturing priority of each parity bit in the codeword sequence according to row destruction and cycle destruction, on the LDPC code check matrix, of a variable node corresponding to each parity bit comprises:

for each parity bit in the codeword sequence, performing summation on the row destruction and the cycle destruction, on the LDPC code check matrix, of the variable node corresponding to the parity bit, and using an obtained sum value as total destruction, on the LDPC code check matrix, of the variable node corresponding to the parity bit; and sequentially determining the puncturing priorities of the parity bits in the codeword sequence in ascending order of values of total destruction, on the LDPC code check matrix, of the variable nodes corresponding to the parity bits in the codeword sequence, wherein a puncturing priority of a parity bit corresponding to a variable node with a smaller total destruction value is lower than a puncturing priority of a parity bit corresponding to a variable node with a larger total destruction value.

7. The method according to claim 1, wherein the puncturing the codeword sequence according to the puncturing priority of each parity bit in the codeword sequence comprises:

determining, in the codeword sequence, a quantity of parity bits that need to be punctured; and puncturing, in ascending order of the puncturing priorities of the parity bits in the codeword sequence, the codeword sequence according to the determined quantity of parity bits that need to be punctured.

8. An apparatus for sending data in a wireless communication system, the apparatus comprising:

a processor to:
encode, by using a low density parity check (LDPC) code check matrix, an information bit to be sent in the wireless communication system, to obtain a codeword sequence, wherein the codeword sequence comprises the information bit and parity bits;
determine a puncturing priority of each parity bit in the codeword sequence according to at least one of row destruction and cycle destruction, on the LDPC code check matrix, of a variable node of the wireless communication system corresponding to each parity bit; and
puncture the codeword sequence according to the puncturing priority of each parity bit in the codeword sequence; and a transmitter, in communication with the processor, to:
generate a bit sequence according to the punctured codeword sequence, and to send the bit sequence in the wireless communication system, wherein the row destruction is used to measure impact of the variable node in the LDPC code check matrix on correct decoding of variable nodes of the wireless communication system adjacent to the variable node, wherein the adjacent variable nodes are variable nodes that are adjacent to the variable node and that are of variable nodes connected to check nodes of the wireless communication system connected to the variable node; and the cycle destruction is used to measure impact of the variable node in the LDPC code check matrix on correct decoding of variable nodes traversed by a minimum cycle corresponding to the variable node, wherein the minimum cycle corresponding to the variable node is a closed figure, with a minimum length, formed by connecting the variable node to surrounding variable nodes and check nodes.

9. The apparatus according to claim 8, wherein for each parity bit in the codeword sequence, the processor determines the row destruction, on the LDPC code check matrix, of the variable node corresponding to the parity bit according to the following formula:

$$RowDestruction(i) = \sum_{m \in G_C(i)} D(m),$$

wherein

RowDestruction(i) represents row destruction caused to the LDPC code check matrix by a variable node VN(i) corresponding to an $i^{th}$ parity bit in the codeword sequence, wherein i=1, 2, L, N, and N represents a quantity of the parity bits in the codeword sequence; $G_C(i)$ represents a set of check nodes CN(m) connected to the variable node VN(i), wherein m=1, K, M and M represents a quantity of the check nodes connected to the variable node VN(i); and D(m) represents a quantity of variable nodes that are adjacent to the variable node VN(i) and that are of the variable nodes connected to the check node CN(m) in the LDPC code check matrix.

10. The apparatus according to claim 9, wherein the processor is specifically configured to:

sequentially determine the puncturing priorities of the parity bits in the codeword sequence in ascending order of values of row destruction, on the LDPC code check matrix, of the variable nodes corresponding to the parity bits in the codeword sequence, wherein a puncturing priority of a parity bit corresponding to a variable node with a smaller row destruction value is lower than a puncturing priority of a parity bit corresponding to a variable node with a larger row destruction value.

11. The apparatus according to claim 8, wherein for each parity bit in the codeword sequence, the processor determines the cycle destruction, on the LDPC code check matrix, of the variable node corresponding to the parity bit according to the following formula:

CycDestruction($i$)=CycNum($i$)*S, wherein

CycDestruction(i) represents cycle destruction caused to the LDPC code check matrix by a variable node VN(i) corresponding to an $i^{th}$ parity bit in the codeword sequence, wherein i=1, 2, L, N and N represents a quantity of the parity bits in the codeword sequence; CycNum(i) represents a quantity of minimum cycles formed by connecting the variable node VN(i) in the LDPC code check matrix to surrounding variable nodes and check nodes; and S is a specified optimization factor, and S>0.

12. The apparatus according to claim 11, wherein the processor is specifically configured to:

sequentially determine the puncturing priorities of the parity bits in the codeword sequence in ascending order of values of cycle destruction, on the LDPC code check matrix, of the variable nodes corresponding to the parity bits in the codeword sequence, wherein a puncturing priority of a parity bit corresponding to a variable node with a smaller cycle destruction value is lower than a puncturing priority of a parity bit corresponding to a variable node with a larger cycle destruction value.

13. The apparatus according to claim 8, wherein the processor is specifically configured to:

for each parity bit in the codeword sequence, perform summation on the row destruction and the cycle destruction, on the LDPC code check matrix, of the variable node corresponding to the parity bit, and use an obtained sum value as total destruction, on the LDPC code check matrix, of the variable node corresponding to the parity bit; and sequentially determine the puncturing priorities of the parity bits in the codeword sequence in ascending order of values of total destruction, on the LDPC code check matrix, of the variable nodes corresponding to the parity bits in the codeword sequence, wherein a puncturing priority of a parity bit corresponding to a variable node with a smaller total destruction value is lower than a puncturing priority of a parity bit corresponding to a variable node with a larger total destruction value.

14. The apparatus according to claim 8, wherein the processor is specifically configured to:

determine, in the codeword sequence, a quantity of parity bits that need to be punctured; and puncture, in ascending order of the puncturing priorities of the parity bits in the codeword sequence, the codeword sequence according to the determined quantity of parity bits that need to be punctured.

* * * * *

UNITED STATES PATENT AND TRADEMARK OFFICE
CERTIFICATE OF CORRECTION

PATENT NO. : 10,135,466 B2  
APPLICATION NO. : 15/337703  
DATED : November 20, 2018  
INVENTOR(S) : Zhouhui Chen et al.

Page 1 of 1

It is certified that error appears in the above-identified patent and that said Letters Patent is hereby corrected as shown below:

On the Title Page

In Item (73) Assignee, delete "HUAWEI TECHNOLOGIES," and insert -- HUAWEI TECHNOLOGIES CO., LTD., -- therefor.

In the Claims

Column 25, Line 19 (approx.), In Claim 2, delete "i=1, 2, L, N" and insert -- $i=1, 2, \cdots, N$ -- therefor.

Column 25, Line 22 (approx.), In Claim 2, delete "m=1, K, M" and insert -- $m=1, \ldots, M$ -- therefor.

Column 27, Line 26 (approx.), In Claim 9, delete "i=1, 2, L, N" and insert -- $i=1, 2, \cdots, N$ -- therefor.

Column 27, Line 29 (approx.), In Claim 9, delete "m=1, K, M" and insert -- $m=1, \ldots, M$ -- therefor.

Column 28, Line 7, In Claim 11, delete "i=1, 2, L, N" and insert -- $i=1, 2, \cdots, N$ -- therefor.

Signed and Sealed this  
Thirty-first Day of March, 2020

Andrei Iancu  
*Director of the United States Patent and Trademark Office*